United States Patent [19]

Tateishi

[11] Patent Number: 4,774,479

[45] Date of Patent: Sep. 27, 1988

[54] PHASE LOCKED LOOP CIRCUIT

[75] Inventor: Hisao Tateishi, Tokyo, Japan

[73] Assignee: NEC Corporation, Tokyo, Japan

[21] Appl. No.: 26,811

[22] Filed: Mar. 17, 1987

[30] Foreign Application Priority Data

Mar. 17, 1986 [JP] Japan .................................. 61-59956

[51] Int. Cl.$^4$ .............................................. H03L 7/08
[52] U.S. Cl. ........................................ 331/1 A; 331/8;
331/17; 328/133; 307/511
[58] Field of Search ................... 331/1 A, 8, 14, 17,
331/25; 328/133, 134, 155; 307/511

[56] References Cited

U.S. PATENT DOCUMENTS 4,316,150 2/1982 Crosby ................................ 331/1 A Primary Examiner—Eugene R. Laroche
Assistant Examiner—Robert J. Pascal
Attorney, Agent, or Firm—Sughrue, Mion, Zinn, Macpeak & Seas

[57] ABSTRACT

A phase locked loop circuit using a reference signal and a response control signal with a preset transition time, comprising a voltage-controlled oscillator to produce a signal variable in phase, a detecting circuit responsive to the reference and variable-phase signals for producing a signal indicating a delay or advance in phase of the variable-phase signal with respect to the reference signal during a phase difference detect period for which the signal from the detecting circuit is indicative of a difference in phase between the reference and variable-phase signals for each period of cycle of the variable-phase signal, a voltage signal generating circuit responsive to the signal from the detecting circuit for producing a voltage signal having first and second states to advance and retard the phase of the variable-phase signal, respectively, and a third state to maintain the phase of the variable-phase signal, the signal generating circuit being responsive to this voltage signal for producing the variable-phase signal with its phase advanced or retarded in response to the first and second state of the control voltage signal or maintained in response to the third state of the control voltage signal, and a response control circuit responsive to the response control signal for conditioning the signal generating circuit to produce the voltage signal with the third state at a time subsequent to the phase difference detect period.

9 Claims, 4 Drawing Sheets

PHASE LOCKED LOOP CIRCUIT

FIELD OF THE INVENTION

The present invention relates to a phase locked loop circuit and, more particularly, to a phase locked loop circuit having variable response characteristics.

BACKGROUND OF THE INVENTION

A phase locked loop circuit is used to produce a signal synchronized in phase with a periodically varying reference signal such as a pulse signal fixed in phase. A type of such a phase locked loop circuit has response characteristics variable in response to a response control signal.

A phase locked loop circuit of this type is used where clock pulse components are to be extracted from signals having synchronizing and data sections such as the signals read out from a flexible memory disc or a compact disc. In such an application of a phase locked loop circuit, the response characteristics of the phase locked loop circuit should be controlled so that the circuit is enabled to respond faster to the response control signal for earlier phase lock for the synchronizing sections of the signals. For the data sections of the signals, it is desirable that the phase locked loop circuit be responsive to the reference control signal at retarded timings so that the circuit is enabled to follow only the fluctuations in the wow flutters which may be caused in the rotary system. On the other hand, in extracting horizontal synchronizing pulses from a composite video signal, the phase locked operation is held in abeyance when the equalizer and vertical synchronizing pulses are appearing during vertical retrace-erase-time intervals.

The present invention relates to improvements in a phase locked loop circuit having such capabilites.

SUMMARY OF THE INVENTION

In accordance with one important aspect of the present invention, there is provided a phase locked loop circuit responsive to a reference signal and a response control signal having a preset transition time from one logic state to another, comprising (a) frequency-controllable oscillator means to oscillate at a controllable frequency for producing a variable-phase signal variable in phase, (b) phase difference detecting means responsive to the reference signal and the variable-phase signal for producing output signals containing information indicative of a difference in phase, if any, between the reference signal and the variable-phase signal, (c) current supply means responsive to the output signals from the phase difference detecting means for producing a charge current or a discharge current depending upon the information represented by the output signals from the phase difference detecting means, (d) frequency control means responsive to the charge current or the discharge current from the current supply means for producing a frequency control signal on the basis of which the frequency at which the frequency-controllable oscillator means is to oscillate is controlled, and (e) response control means responsive to the response control signal for prohibiting the current supply means from producing the charge current or discharge current. The response control means may comprise delay means operative to maintain the response control means irresponsive to the response control signal while the signals containing the information indicative of the difference in phase between the reference signal and the variable-phase signal are being output from the phase difference detecting means.

In accordance with another important aspect of the present invention, there is provided a phase locked loop circuit responsive to a reference signal and a response control signal having a preset transition time, comprising (a) signal generating means for producing a variable-phase signal variable in phase, (b) phase difference detecting means responsive to the reference signal and the variable-phase signal for producing an output signal indicative of a delay or advance in phase of the variable-phase signal with respect to the reference signal during a phase difference detect period for which a difference in phase, if any, between the reference signal and the variable-phase signal is to be detected for each period of cycle of the variable-phase signal, (c) voltage signal generating means responsive to the output signal from the phase difference detecting means for producing a voltage signal having a three different states consisting of a first state producing a voltage level effective to advance the phase of the variable-phase signal, a second voltage level effective to retard the phase of the variable-phase signal, and a third state floating between the first and second voltage levels and effective to maintain the phase of the variable-phase signal, (d) the signal generating means being responsive to the voltage signal for producing the variable-phase signal with an advanced phase in response to the first state of the voltage signal, with a retarded phase in response to the second state of the voltage signal, and a phase maintained in response to the third state of the voltage signal, and (e) response control means responsive to the response control signal for forcibly conditioning the voltage signal generating means to produce the voltage signal with the third state at a time later than the preset transition time of the response control signal and subsequent to the phase difference detect period.

In one preferred embodiment of the present invention, there is provided a phase locked loop circuit responsive to a reference pulse signal which is fixed in phase and a response control pulse signal having a preset transition time, comprising (a) voltage-responsive pulse signal generating means for producing a variable-phase pulse signal which is variable in phase, (b) phase difference detecting means responsive to the reference pulse signal and the variable-phase pulse signal for producing a first output signal indicative of a delay in phase of the variable-phase pulse signal with respect to the reference pulse signal and a second output signal indicative of an advance in phase of the variable-phase pulse signal with respect to the reference pulse signal, during a phase difference detect period for which a difference in phase, if any, between the reference pulse signal and the variable-phase pulse signal is to be detected for each period of cycle of the variable-phase pulse signal, (c) voltage signal generating means responsive to the first and second output signals for producing first and second voltage signals each having a three different states consisting of a first state producing a first voltage level effective to advance the phase of the variable-phase pulse signal, a second voltage level effective to retard the phase of the variable-phase pulse signal and a third state floating between the first and second voltage levels and effective to maintain the phase of the variable-phase pulse signal, (d) voltage smoothing means for smoothing out the first and second voltage signals and thereby producing a control signal also having the three states, (e) the pulse signal generating means being responsive to the control voltage signal for producing the variable-phase pulse signal with an advanced phase in response to the first state of the voltage signal, with a retarded phase in response to the second state of the voltage signal, and a phase maintained substantially unchanged in response to the third state of the voltage signal, and (f) response control means responsive to the response control pulse signal for forcibly conditioning the voltage signal generating means to produce the first and second voltage signals with the third state at a time later than the preset transition time of the response control pulse signal and subsequent to the phase difference detect period.

In another preferred embodiment of the present invention, there is provided a phase locked loop circuit responsive to a reference pulse signal which is fixed in phase and a response control pulse signal having a preset transition time, comprising (a) voltage-responsive pulse signal generating means for producing a variable-phase pulse signal which has two logic states and which is variable in phase, (b) phase difference detecting means responsive to the reference pulse signal and the variable-phase pulse signal for producing, during a phase difference detect period for which a difference in phase, if any, between the reference pulse signal and the variable-phase pulse signal is to be detected for each period of cycle of the variable-phase pulse signal, a first output signal having one logic state and lasting from the beginning of the phase difference detect period to an intermediate time at which the variable-phase pulse signal swings from one logic state to another and a second output signal having another logic state and lasting from the intermediate time to the end of the phase difference detect period, (c) voltage signal generating means responsive to the first and second output signals for producing a voltage signal having three different states consisting a first state producing a first voltage level effective to advance the phase of the variable-phase pulse signal in response to the first output signal, a second voltage level effective to retard the phase of the variable-phase pulse signal in response to the second output signal, and a third state floating between the first and second voltage levels and effective to maintain the phase of the variable-phase pulse signal, the voltage signals with the third state being produced prior and posterior to the phase difference detect period during each period of cycle of the variable-phase pulse signal, (d) the pulse signal generating means being responsive to the voltage signal for producing the variable-phase pulse signal with an advanced phase in response to the first state of the voltage signal, with a retarded phase in response to the second state of the voltage signal, and a phase maintained substantially unchanged in response to the third state of the voltage signal, and (e) response control means responsive to the response control pulse signal for forcibly conditioning the voltage signal generating means to produce the voltage signal with the third state at a time later than the preset transition time of the response control pulse signal and subsequent to the phase difference detect period.

BRIEF DESCRIPTION OF THE DRAWINGS

The features and advantages of a phase locked loop circuit according to the present invention will be more clearly appreciated from the following description taken in conjunction with the accompanying drawings in which like reference numerals designate similar or corresponding units and elements and in which.

DESCRIPTION OF THE PREFERRED EMBODIMENTS

Figure 1:
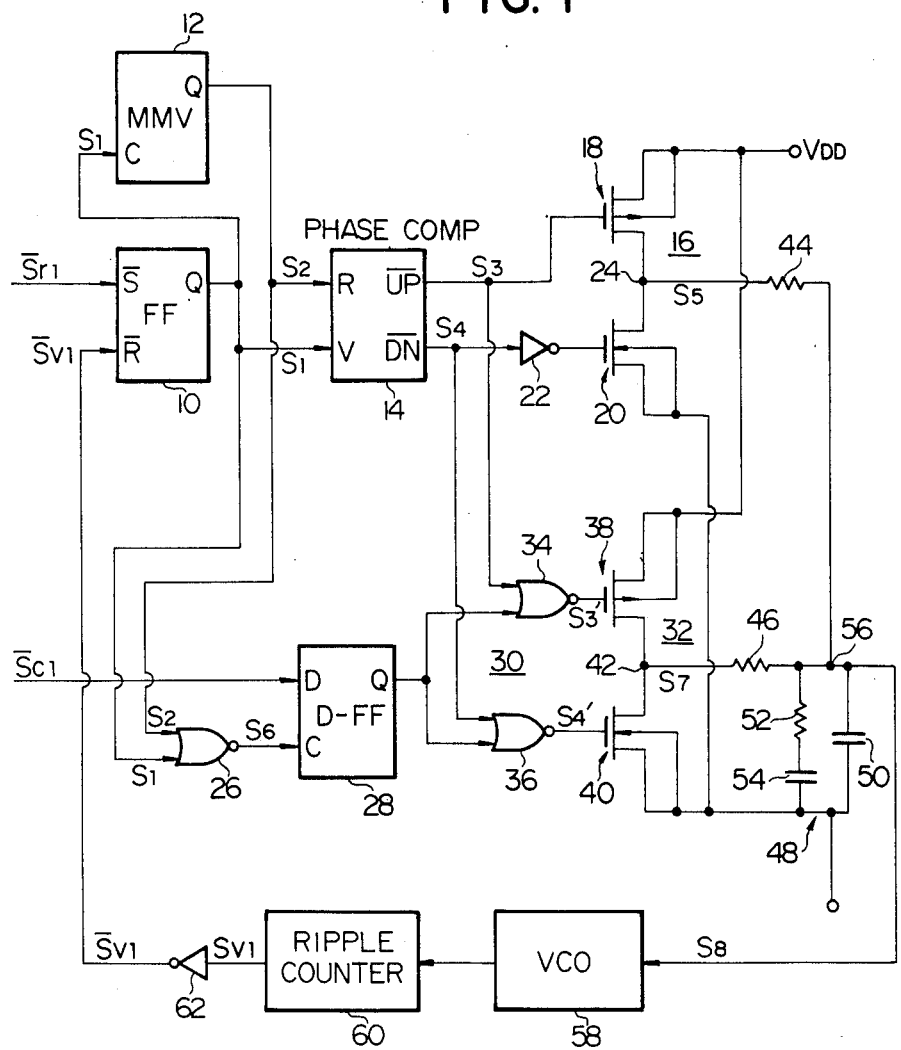
FIG. 1 is a block diagram showing a preferred embodiment of a phase locked loop circuit according to the present invention.
Figure 2:
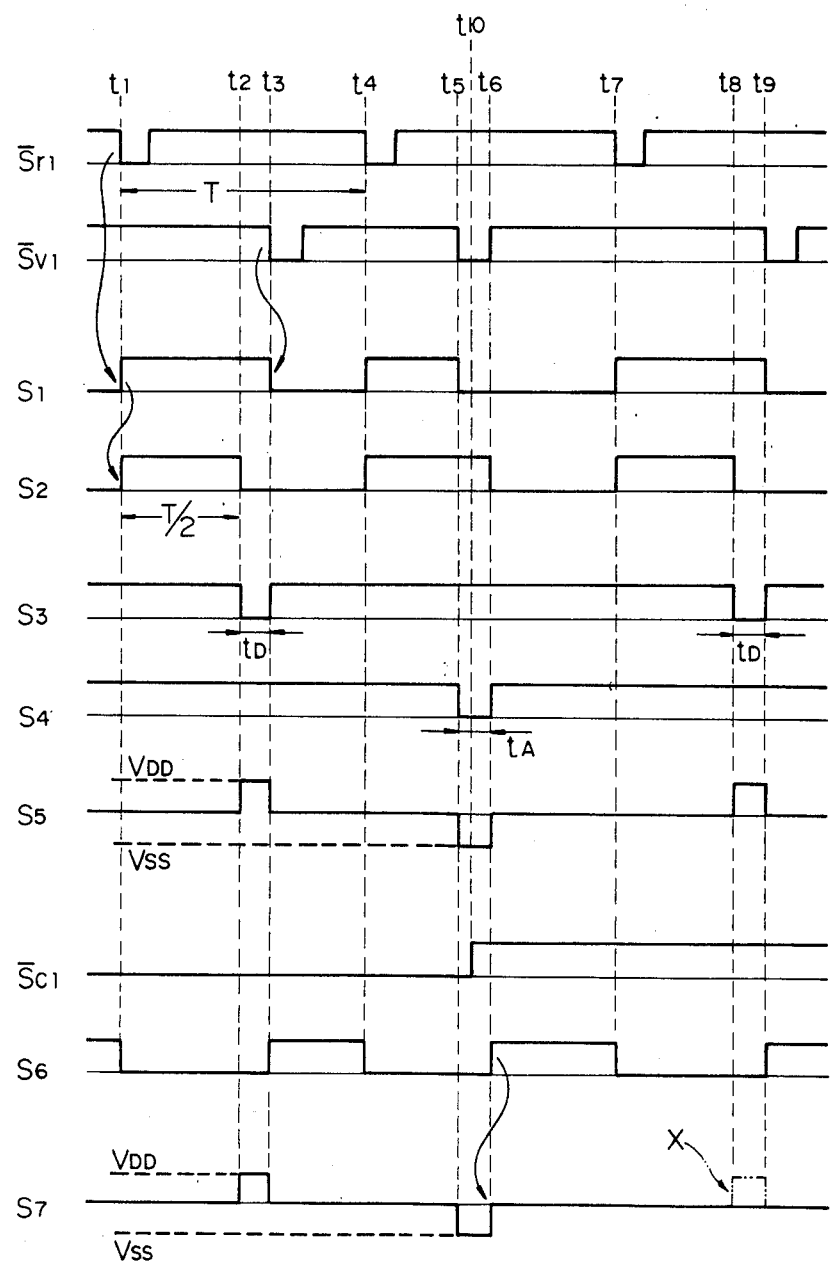
FIG. 2 is a time chart showing the waveforms of various pulse signals which may appear in the phase locked loop circuit shown in FIG. 1.

Referring to FIG. 1 of the drawings, a phase locked loop circuit embodying the present invention comprises a set-reset flip-flop circuit 10 (labeled as FF) having a set terminal S responsive to a reference pulse signal $\bar{S}_{r1}$ with a predetermined period T as shown in the time chart of FIG. 2 and a reset terminal $\bar{S}$ responsive to a variable input pulse signal $\bar{S}_{v1}$. The input pulse signal $\bar{S}_{v1}$ is representative of the signal or, more precisely, the inverted version of the pulse signal to be controlled by the loop circuit according to the present invention. The set-reset flip-flop circuit 10 further has an output terminal Q to produce an output signal $S_1$ in response to the falling edges of the pulse signal $\bar{S}_{r1}$ input to the set terminal $\bar{S}$. The output pulse signal $S_1$ from the set-reset flip-flop circuit 10 is supplied to the trigger terminal C of a monostable multivibrator 12 (labeled as MMV) which has an output terminal to produce in response to the input pulse signal $S_1$ an output pulse signal $S_2$ with a predermined pulsewidth T/2 equal to the period T of the reference pulse signal $\bar{S}_{r1}$ as shown in FIG. 2. There is further provided a phase comparator 14 which has first and second input terminals V and R responsive to the pulse signals $S_1$ and $S_2$, respectively, from the flip-flop circuit 10 and monostable multivibrator 12 and first and second output terminals $\overline{UP}$ and $\overline{DN}$ to produce output pulse signals $S_3$ and $S_4$, respectively. The pulse signal $S_3$ from the first output terminal $\overline{UP}$ has a logic "0" level when the pulse signal $\bar{S}_{v1}$ to be controlled is backwardly out of phase with the reference pulse signal $\bar{S}_{r1}$ and otherwise a logic "1" level, as shown in FIG. 2. On the other hand, the pulse signal $S_4$ from the second output terminal $\overline{DN}$ has a logic "0" level when the pulse signal $\bar{S}_{v1}$ is forwardly out of phase with the reference pulse signal $\bar{S}_{r1}$ and otherwise a logic "1" level, as also shown in FIG. 2. The phase comparator 14 to achieve these functions may be of any of the desired types and/or designs.

The signals $S_3$ and $S_4$ from the output terminals $\overline{UP}$ and $\overline{DN}$ of the phase comparator 14 are supplied to a first charge pump circuit 16 of CMOS (complementary metal-oxide semiconductor) configuration. The charge pump circuit 16 is adapted to discriminate whether or not the pulse signals $\bar{S}_{v1}$ and $\bar{S}_{r1}$ input to the flip-flop circuit 10 are in phase with each other and, if not, whether the pulse signal $\bar{S}_{v1}$ is forwardly or backwardly out of phase with the pulse signal $\bar{S}_{r1}$. Such a charge pump circuit 16 comprises a series combination of p-channel and n-channel field-effect transistors 18 and 20 connected between sources of an appropriate "high" voltage such as a positive supply voltage $V_{DD}$ and an appropriate "low" voltage such as ground potential $V_{SS}$. The p-channel field-effect transistor 18 has its gate connected to the first output terminal $\overline{UP}$ of the phase comparator 14 and its source terminal connected to the source of the positive supply voltage $V_{DD}$. The n-channel field-effect transistor 20 has its gate connected through an inverter 22 to the second output terminal $\overline{DN}$ of the phase comparator 14 and its source terminal connected to the source of the ground potential $V_{SS}$. The respective drain terminals of the transistors 18 and 20 are connected together to provide an output node 24 at which is to be produced a first voltage signal $S_5$ of either a high level or a low level or of a high-impedance state floating between the high and low levels depending on the respective logic states of the pulse signals $S_3$ and $S_4$ output from the phase comparator. In the presence of the signal $S_3$ of the logic "0" level and concurrently the signal $\overline{S}_4$ of the logic "1" level with the pulse signal $\overline{S}_{v1}$ backwardly out of phase with the reference pulse signal $\overline{S}_{r1}$, the p-channel field-effect transistor 18 is turned on with the n-channel field-effect transistor 20 turned off. The output node 24 of the charge pump circut 16 is now connected to the source of the positive supply voltage $V_{DD}$ through the p-channel field-effect transistor 18 so that a high voltage approximating the supply voltage $V_{DD}$ appears as the first voltage signal $S_5$ at the output node 24 of the charge pump circuit 16. When, on the other hand, the pulse signal $\overline{S}_{v1}$ is forwardly out of phase with the reference pulse signal $\overline{S}_{r1}$ so that the signal $S_3$ is of the logic "1" level and concurrently the signal $S_4$ is of logic "0" level, the n-channel field-effect transistor 20 is turned on and the p-channel field-effect transistor 18 is turned off. The output node 24 of the charge pump circuit 16 is now connected to the source of the ground potential $V_{SS}$ through the n-channel field-effect transistor 20 so that a low voltage approximating the ground potential $V_{SS}$ appears as the voltage signal $S_5$ at the node 24 of the charge pump circuit 16. It will thus be seen that the voltage signal $S_5$ of a high level as appearing at the output node 24 of the charge pump circuit 16 indicates that the pulse signal $\overline{S}_{v1}$ is backwardly out of phase with the reference pulse signal $\overline{S}_{r1}$ and, conversely, the voltage signal $S_5$ of a low level as appearing at the node 24 indicates that the pulse signal $\overline{S}_{v1}$ is forwardly out of phase with the reference pulse signal $\overline{S}_{r1}$. In the presence of the pulse signals $S_3$ and $S_4$ each of a logic "1" level as appearing when, for example, the pulse signals $\overline{S}_{v1}$ and $\overline{S}_{r1}$ are in phase with each other, both of the p-channel and n-channel field-effect transistors 18 and 20 are turned off so that the first voltage signal $S_5$ at the output node 24 assumes a high-impedance state floating between the supply voltage $V_{DD}$ and ground potential $V_{SS}$.

The phase locked loop circuit embodying the present invention further comprises a two-input logic NOR 26 and a delay-latch flip-flop circuit 28. The logic NOR gate 26 has one of its input terminals connected to the output terminal Q of the set-reset flip-flip circuit 10 and the other of the input terminals connected to the output terminal Q of the monostable multivibrator 12. The NOR gate 26 is thus responsive the pulse signal $S_1$ from the flip-flop circuit 10 and the pulse signal $S_2$ from the multivibrator 12 and further has an output terminal to produce an output signal $S_6$ of a logic "1" level in the presence concurrently of the pulse signals $S_1$ and $S_2$ each of the logic "0" level. The delay-latch flip-flop circuit 28 has an input terminal D responsive to a response control pulse signal $\overline{S}_{c1}$ and a control terminal C connected to the output terminal of the NOR gate 26.

The delay-latch flip-flop circuit 28 is thus responsive to the response control pulse signal $\overline{S}_{c1}$ and the pulse signal $S_6$ from the NOR gate 26 to produce an output pulse signal of a state which the pulse signal $\overline{S}_{c1}$ has at the instant the pulse signal $S_6$ from the NOR gate 26 rises from a logic "0" level to a logic "1" level (or, if desired, falls from the logic "1" level to the logic "0" level), as well known in the art.

The signals $S_3$ and $S_4$ from the output terminals $\overline{UP}$ and $\overline{DN}$ of the phase comparator 14 are further supplied through a logic circuit 30 to a second charge pump circuit 32 which is also of CMOS configuration. The logic circuit 30 comprises a two-input logic OR gate 34 and a two-input logic NOR gate 36. The logic OR gate 34 has one of its input terminals connected to the first output terminal $\overline{UP}$ of the phase comparator 24 and the other of the input terminals connected to the output terminal Q of the delay-latch flip-flop circuit 28. The logic NOR gate 36 has one of its input terminals connected to the second output terminal $\overline{DN}$ of the phase comparator 24 and the other of the input terminals also connected to the output terminal Q of the delay-latch flip-flop circuit 28. On the other hand, the second charge pump circuit 32 comprises a series combination of p-channel and n-channel field-effect transistors 38 and 40 connected between the sources of the positive supply voltage $V_{DD}$ and ground potential $V_{SS}$. The p-channel field-effect transistor 38 of the charge pump circuit 32 has its gate connected to the output terminal of the logic OR gate 34 and its source terminal connected to the source of the positive supply voltage $V_{DD}$. The n-channel field-effect transistor 40 of the charge pump circuit 32 has its gate connected to the output terminal of the logic NOR gate 36 and its source terminal connected to the source of the ground potential $V_{SS}$. The respective drain terminals of the transistors 38 and 40 are connected together to provide an output node 42 at which is to be produced a second voltage signal $S_7$ of either a high level or a low level or of a high-impedance state floating between the high and low levels depending on the respective logic states of the pulse signals appearing at the output terminals of the OR and NOR gates 34 and 36. In the presence of a pulse signal of a logic "0" level at each of the output terminals of the OR and NOR gates 34 and 36, the p-channel field-effect transistor 38 is turned on with the n-channel field-effect transistor 40 turned off. The output node 42 of the charge pump circuit 32 is now connected to the source of the positive supply voltage $V_{DD}$ through the p-channel field-effect transistor 38 so that a high voltage approximating the supply voltage $V_{DD}$ appears as the second voltage signal $S_7$ at the output node 42 of the charge pump circuit 32. When, on the other hand, a pulse signal of a logic "1" level is present at each of the output terminals of the OR and NOR gates 34 and 36, the n-channel field-effect transistor 40 is turned on and the p-channel field-effect transistor 38 turned off. The output node 42 of the charge pump circuit 32 is now connected to the source of the ground potential $V_{SS}$ through the n-channel field-effect transistor 40 so that a low voltage approximating the ground potential $V_{SS}$ appears as the second voltage signal $S_7$ at the output node 42 of the charge pump circuit 32. Thus, the voltage signal $S_7$ of a high level as appearing at the output node 42 of the charge pump circuit 32 indicates that both of the pulse signals input to the OR gate 34 are of logic "0" level and, in addition, at least one of the pulse signals input to the NOR gate 36 is of a logic "1" level.

On the other hand, the second voltage signal $S_7$ of a low level as appearing at the output node 42 of the charge pump circuit 32 indicates that at least one of the pulse signals input to the OR gate 34 is of a logic "1" level and, in addition, both of the pulse signals input to the NOR gate 36 are of logic "0" levels. When at least one of the pulse signals input to the OR gate 34 is of a logic "1" level and, concurrently, at least one of the pulse signals input to the NOR gate 36 is of a logic "1" level, both of the p-channel and n-channel field-effect transistors 38 and 40 are turned off in the presence of a pulse signal (represented by $S_3'$) of a logic "1" level at the output terminal of the OR gate 34 and a pulse signal (represented by $S_4'$) of a logic "0" level at the output terminal of the NOR gate 36. The second voltage signal $S_7$ at the output node 42 of the charge pump circuit 32 now assumes a high-impedance state floating between the supply voltage $V_{DD}$ and ground potential $V_{SS}$.

The voltage signals $S_5$ and $S_7$ thus appearing at the output nodes 24 and 42 of the first and second charge pump circuits 16 and 32 are supplied through resistors 44 and 46, respectively, to a low-pass filter network 48. The low-pass filter network 48 comprises a capacitor 50 connected in parallel with a series combination of a resistor 52 and a capacitor 54 and has an output node 56 at which is to appear a control voltage signal $S_8$ to result from the first and second voltage signals $S_5$ and $S_7$. The control voltage signal $S_8$ thus appearing at the output node 56 of the low-pass filter network 48 is supplied to a voltage controlled oscillator circuit 58 (labeled as VCO) which has an output terminal connected to a ripple-carry counter 60. The voltage controlled oscillator circuit 58 is operative to produce a pulse signal with a phase advanced in response to an increase in the control voltage signal $S_8$ and retarded in response to a decrease in the control voltage signal $S_8$. The ripple-carry counter 60 in turn has an output terminal connected through an inverter 62 to the reset terminal $\overline{R}$ of the flip-flop circuit 10 for supplying thereto the pulse signal $\overline{S}_{vl}$ or the inverted version of the pulse signal ($S_{vl}$) to be controlled by the loop circuit under consideration. The ripple-carry counter 60 may be of any of the desired types and/or designs known in the art.

Description will now be made with reference to FIGS. 1 and 2 in regard to the operation of the phase locked loop circuit thus constructed and arranged.

It is assumed by way of example that the reference pulse signal $\overline{S}_{rl}$ supplied to the set terminal $\overline{S}$ of the flip-flop circuit 10 is to fall at times $t_1, t_4, t_7, \ldots$ while the pulse signal $\overline{S}_{vl}$ supplied to the reset terminal $\overline{R}$ of the flip-flop circuit 10 is to fall at times $t_3, t_5, t_9, \ldots$ which are respectively subsequent to the times $t_1, t_4, t_7, \ldots$ as shown in the time chart of FIG. 2. As noted previously, the reference pulse signal $\overline{S}_{rl}$ has a predetermined period T so that the times $t_1, t_4, t_7, \ldots$ are herein assumed to occur at intervals equal to the period of cycle T. The times indicated by $t_2, t_6$ and $t_8$ represent the middle points of the successive periods T each intervening between a falling edge and the immediately subsequent leading edge. From FIG. 2 it will thus be understood that the pulse signal $\overline{S}_{vl}$ to be controlled by the phase locked loop circuit shown has a falling edge which is either delayer or advanced with respect to the middle point of each of the periods T. The pulse signal $\overline{S}_{vl}$ has a falling edge delayed with respect to the middle point $t_2$ or $t_8$ of the period intervening between the times $t_1$ and $t_4$ or between the time $t_7$ and the time (not shown) at which the pulse signal $\overline{S}_{vl}$ is to fall thereafter. The pulse signal $\overline{S}_{vl}$ further has a falling edge which is advanced with respect to the middle point $t_6$ of the period intervening between the times $t_4$ and $t_7$. It is further assumed that the reference control pulse signal $\overline{S}_{cl}$ supplied to the input terminal D of the delay-latch flip-flop circuit 28 remains at a logic "0" level by time $t_{10}$ intervening between the times $t_5$ and $t_6$ and swings from the logic "0" level to logic "1" level at such a time $t_{10}$ as also shown in the time chart of FIG. 2.

The set-reset flip-flop circuit 10 is set at each of the falling edges of the reference pulse signal $\overline{S}_{rl}$ and produces an output pulse signal $S_1$ which rises at times $t_1, t_4, t_7, \ldots$ and falls at times $t_3, t_5, t_9, \ldots$ as shown. On the other hand, the monostable multivibrator 12 is triggered at each of the falling edges of the pulse signal $S_1$ and produces an output pulse signal $S_2$ which rises at times $t_1, t_4, t_7, \ldots$ and falls at times $t_2, t_6, t_8, \ldots$ which occur upon lapse of the delay time equal to one half (T/2) of the period T of the pulse signal $\overline{S}_{rl}$ after the times $t_1, t_5, t_7, \ldots$ as shown. Thus, the pulse signal $S_2$ produced from the monostable multivibrator 12 has a frequency doubling the frequency of the reference pulse signal $\overline{S}_{rl}$ and the times $t_2, t_6, t_8, \ldots$ occur at the middle points between the successive times $t_1, t_4, t_7, \ldots$ at which reference pulse signal $\overline{S}_{rl}$ falls. In addition, the falling edges of the pulse signal $S_1$ are synchronized with the falling edges of the pulse signal $\overline{S}_{vl}$ and the falling edges of the pulse signal $S_2$ synchronized with the middle points between the successive falling edges of the reference signal $\overline{S}_{rl}$. Thus, an advance or a delay in the falling edge of the pulse signal $S_1$ with respect to the falling edge of the pulse signal $S_2$ respectively corresponds to the advance or delay in phase of the pulse signal $\overline{S}_{vl}$ with respect to the reference pulse signal $\overline{S}_{rl}$.

In response to these two pulse signals $S_1$ and $S_2$ from the flip-flop circuit 10 and monostable multivibrator 12, the phase comparator 14 produces pulse signals $S_3$ and $S_4$ at its first and second output terminals $\overline{UP}$ and $\overline{DN}$. As noted previously, the pulse signal $S_3$ has the logic "0" level when the pulse signal $\overline{S}_{vl}$ to be controlled is backwardly out of phase with the reference pulse signal $\overline{S}_{rl}$ and otherwise the logic "1" level and while the pulse signal $S_4$ has the logic "0" level when the pulse signal $\overline{S}_{vl}$ is forwardly out of phase with the reference pulse signal $\overline{S}_{rl}$ and otherwise the logic "1" level. Thus, the phase comparator 14 produces the pulse signal $S_3$ of the logic "0" level during, for example, the period of time intervening between the times $t_2$ and $t_3$ and the period of time intervening between the times $t_8$ and $t_9$ as shown while the pulse signal $S_4$ of the logic "0" level during, for example, the period of time intervening between the times $t_5$ and $t_6$. Thus, the logic "0" level of either the pulse signal $S_3$ or the pulse signal $S_4$ indicates an advance or a delay in the falling edge of the pulse signal $S_1$ with respect to the falling edge of the pulse signal $S_2$ or, in other words, an advance or delay in phase of the pulse signal $\overline{S}_{vl}$ with respect to the reference pulse signal $\overline{S}_{rl}$. It may also be noted that each of the periods of time $t_2$-$t_3$ and $t_8$-$t_9$ for which the pulse signal $S_3$ remains at the logic "0" level and the period of time $t_5$-$t_6$ for which the pulse signal $S_4$ remains at the logic "0" level is proportional to the amount of phase difference between the pulse signals $\overline{S}_{vl}$ and $\overline{S}_{rl}$. This means that each of the pulse signals $S_3$ and $S_4$ provides information regarding the phase difference of the pulse signal $\overline{S}_{vl}$ advanced or delayed with respect to the reference pulse signal $\overline{S}_{rl}$ during a period of time when the pulse signal $S_3$ or $S_4$ is maintained at the logic "0" level. Such a period of time will be herein referred to as phase difference detect period and is denoted by $t_A$ for an advanced phase and by $t_D$ for a delayed phase in the time chart of FIG. 2.

During a phase difference detect period $t_D$ for which the pulse signal $S_3$ is of the logic "0" level and concurrently the pulse signal $S_4$ is of the logic "1" level, the p-channel field-effect transistor 18 of the first charge pump circuit 16 is turned on as at time $t_2$ or time $t_8$ with the n-channel field-effect transistor 20 turned off. A high voltage approximating the positive supply voltage $V_{DD}$ thus appears as the first voltage signal $S_5$ of a high level at the output node 24 of the charge pump circuit 16 as will be seen from FIG. 2. On the other hand, during a phase difference detect period $t_A$ for which the pulse signal $S_4$ is of the logic "0" level and concurrently the pulse signal $S_3$ is of the logic "1" level, the n-channel field-effect transistor 20 of the charge pump circuit 16 is turned on as at time $t_5$ with the p-channel field-effect transistor 18 turned off. A low voltage approximating the ground potential $V_{SS}$ appears as the first voltage signal $S_5$ of a low level at the output node 24 of the charge pump circuit 16 as will be seen from FIG. 2. When both of the pulse signals $S_3$ and $S_4$ from the phase comparator 14 are maintained at the logic "1" levels with, for example, the the p-channel and n-channel field-effect transistors 18 and 20 are turned off so that the first voltage signal $S_5$ at the output node 24 assumes a high-impedance state floating between the supply voltage $V_{DD}$ and ground potential $V_{SS}$ as will be also seen from FIG. 2.

When both of the pulse signals $S_1$ and $S_2$ are concurrently of the logic "0" levels, the NOR gate 26 produces a logic "1" output signal as the pulse signal $S_6$ and supplies the logic "1" pulse signal $S_6$ to the control terminal C of the delaylatch flip-flop circuit 28. The pulse signal $S_6$ from the NOR gate 26 thus falls at times $t_1, t_4, t_7, \ldots$ and rises at times $t_3, t_6, t_9, \ldots$ as will be seen from FIG. 2. On the other hand, the reference control pulse signal $\overline{S}_{c1}$ appearing at the input terminal D of the delay-latch flip-flop circuit 28 swings from the logic "0" level to the logic "1" level as at time $t_{10}$ intervening between the times $t_5$ and $t_6$. At this point of time $t_{10}$, however, the pulse signal $S_6$ from the NOR gate 26 remains at the logic "0" levels as shown so that the pulse signal at the output terminal Q of the delay-latch flip-flop circuit 28 still remains at the logic "0" level. As will be seen, it is at time $t_6$ when the pulse signal at the output terminal Q of the flip-flop circuit 28 swings to the logic "1" level so that, until the time $t_6$, the pulse signal at the output terminal Q of the flip-flop circuit 28 is maintained at the logic "0" level.

At time $t_2$ when the first phase difference detect period $t_D$ begins, the pulse signal $S_3$ from the first output terminal $\overline{UP}$ of the phase comparator 14 shifts from the logic "1" level to logic "0" level. In the presence now of the logic "0" pulse signal at both of its input terminals, the OR gate 34 of the logic circuit 30 is conditioned to produce a logic "0" signal as its output pulse signal $S_3'$ and activates the p-channel field-effect transistor 38 of the second charge pump circuit 32 to turn on as at time $t_2$. On the other hand, the pulse signal $S_4$ from the second output terminal $\overline{DN}$ of the phase comparator 14 is held at the logic "1" level at time $t_2$ so that the NOR gate 36 of the logic circuit 30 is producing a logic "0" signal as its output pulse signal $S_4'$ and allows the n-channel field-effect transistor 40 of the charge pump circuit 32 to be turned off. At time $t_2$, a high voltage approximating the positive supply voltage $V_{DD}$ thus appears at the output node 42 of the charge pump circuit 32. During the phase difference detect period $t_D$ intervening between the times $t_2$ and $t_3$, the high voltage approximating the supply voltage $V_{DD}$ is thus established as the second voltage signal $S_7$ at the output node 42 of the charge pump circuit 32 as will be seen from FIG. 2. At time $t_3$ when the phase difference detect period $t_D$ terminates, the pulse signal $S_3$ from the first output terminal $\overline{UP}$ of the phase comparator 14 shifts from the logic "1" back to the level logic "0" level. It therefore follows that the pulse signal $S_3'$ output from the OR gate 34 also swings back to the logic "1" level and accordingly the p-channel field-effect transistor 38 of the charge pump circuit 32 is turned off at time $t_3$.

At time $t_5$ when the phase difference detect period $t_A$ begins, the pulse signal $S_3$ from the first output terminal $\overline{UP}$ of the phase comparator 14 remains at the logic "1". With the logic "0" pulse signal present at one of its input terminals and the logic "0" pulse signal at the other, the OR gate 34 of the logic circuit 30 is now conditioned to produce a logic "1" signal as its output pulse signal $S_3'$ and causes the p-channel field-effect transistor 38 of the second charge pump circuit 32 to turn off at time $t_5$. On the other hand, the pulse signal $S_4$ from the second output terminal $\overline{DN}$ of the phase comparator 14 swings from the logic "1" level to logic "0" level at time $t_5$ so that the NOR gate 36 of the logic circuit 30 is conditioned to produce a logic "1" signal as its output pulse signal $S_4'$ and activates the n-channel field-effect transistor 40 of the charge pump circuit 32 to turn on. At time $t_5$, a low voltage approximating the ground potential $V_{SS}$ thus appears at the output node 42 of the charge pump circuit 32. During the phase difference detect period $t_A$ intervening between the time $t_5$ and $t_6$, the high voltage approximating the supply voltage $V_{DD}$ is thus established as the second voltage signal $S_7$ at the output node 42 of the charge pump circuit 32 as will be seen from FIG. 2.

At time $t_{10}$ immediately subsequent to the time $t_5$, the reference control pulse signal $S_{c1}$ appearing at the input terminal D of the delay-latch flip-flop circuit 28 swings from the logic "0" level to the logic "1" level. When the pulse signal $S_2$ from the monostable multivibrator 12 then falls to the logic "0" level at time $t_6$ subsequent to the time $t_{10}$, the pulse signal $S_6$ from the NOR gate 26 shifts from the logic "0" level to logic "1" level so that the pulse signal at the output terminal Q of the delay-latch flip-flop circuit 28 is now allowed to rise from the logic "0" level to logic "1" level. With the logic "1" pulse signal thus produced at one of its input terminals, the NOR gate 36 of the logic circuit 30 now outputs a logic "0" pulse signal to cause the associated n-channel field-effect transistor 40 of the charge pump circuit 32 to turn off at time $t_6$, thereby putting an end to the phase difference detect period $t_D$ as will be seen from FIG. 2.

When both of the signals $S_3$ and $S_4$ output from the phase comparator 14 are of the logic "1" levels with, for example, the pulse signal $\overline{S}_{v1}$ held in phase with the reference pulse signal $\overline{S}_{r1}$ and/or when the pulse signal output from the delay-latch flip-flip circuit 28 is swung to the logic "1" level, there concurrently are a logic "1" pulse signal $S_3'$ at the output terminal of the OR gate 34 and a logic "0" pulse signal $S_4'$ at the output terminal of the NOR gate 36. Both of the p-channel and n-channel field-effect transistors 38 and 40 of the second charge pump circuit 32 are thus turned off so that the voltage signal $S_7$ at the output node 42 of the second charge pump circuit 32 assumes a high-impedance state floating between the supply voltage $V_{DD}$ and ground potential $V_{SS}$ as will be also seen from FIG. 2.

As will have been seen from the foregoing description, the voltage signal $S_5$ at the output node 24 of the first charge pump circuit 16 assumes a high voltage level approximating the supply voltage $V_{DD}$ during a phase difference detect period $t_D$ when the input pulse signal $\bar{S}_{v1}$ to be controlled is backwardly out of phase with the reference pulse signal $\bar{S}_{r1}$. During the phase difference detect period $t_A$ when the pulse signal $\bar{S}_{v1}$ to be controlled is forwardly out of phase with the reference pulse signal $\bar{S}_{r1}$, the first voltage signal $S_5$ assumes a low voltage level approximating the ground potential $V_{SS}$. Such a high or low voltage signal $S_5$ is produced without respect to the logic state of the response control pulse signal $\bar{S}_{c1}$ supplied to the delay-latch flip-flop circuit 28. The voltage signal $S_7$ at the output node 42 of the second charge pump circuit 32 may also assumes a high voltage level approximating the supply voltage $V_{DD}$ during a phase difference detect period $t_D$ when the pulse signal $\bar{S}_{v1}$ is backwardly out of phase with the reference pulse signal $\bar{S}_{r1}$. Likewise, during the phase difference detect period $t_A$ when the pulse signal $\bar{S}_{v1}$ is forwardly out of phase with the reference pulse signal $\bar{S}_{r1}$, the first voltage signal $S_5$ may assume a low voltage level approximating the ground potential $V_{SS}$. Such a high or low voltage signal $S_5$ is produced in the presence of the logic "0" level at the output terminal Q of the delay-latch flip-flop circuit 28 which is responsive to the response control pulse signal $\bar{S}_{c1}$ supplied to the input terminal D thereof.

The high or low voltage signals $S_5$ and $S_7$ thus produced at the output nodes 24 and 42 of the first and second charge pump circuits 16 and 32, respectively, are fed to the low-pass filter network 48 which thus produces the previously mentioned control voltage signal $S_8$ at its output node 56. The control voltage signal $S_8$ resulting from the first and second voltage signals $S_5$ and $S_7$ is, in turn, supplied to the voltage controlled oscillator circuit 58 to increase or decrease the control voltage for the oscillator circuit 58. During phase difference detect periods $t_D$ for which the pulse signal $\bar{S}_{v1}$ to be controlled is backwardly out of phase with the reference pulse signal $\bar{S}_{r1}$, the voltage controlled oscillator circuit 58 receives the control voltage signal $S_8$ which is increased in response to the first and second voltage signals $S_5$ and $S_7$ approximating the supply voltage $V_{DD}$ if the pulse signal output from the delay-latch flip-flop circuit 28 is of the logic "0" level. In response to such a control voltage signal $S_8$, the voltage controlled oscillator circuit 58 is conditioned to generate pulses with an advanced phase so that the pulse signal $\bar{S}_{v1}$ to be controlled synchronizes with the reference pulse signal $\bar{S}_{r1}$. On the other hand, during phase difference detect periods $t_A$ for which the pulse signal $\bar{S}_{v1}$ to be controlled is forwardly out of phase with the reference pulse signal $\bar{S}_{r1}$, the voltage controlled oscillator circuit 58 receives the control voltage signal $S_8$ decreased in response to the voltage signals $S_5$ and $S_7$ approximating the ground potential $V_{SS}$ if, also, the pulse signal output from the delay-latch flip-flop circuit 28 is of the logic "0" level. In response to such a control voltage signal $S_8$, the voltage controlled oscillator circuit 58 is conditioned to generate pulses with a retarded phase so that the pulse signal $\bar{S}_{v1}$ synchronizes with the reference pulse signal $\bar{S}_{r1}$. As the pulses generated by the voltage controlled oscillator circuit 58 are thus advanced or retarded in phase, the pulse signal output from the ripple-carry counter 60 and accordingly its inverted version, viz., the pulse signal $\bar{S}_{v1}$ as appearing at the output terminal of the inverter 62 subsequent to the counter 60 is also advanced or retarded in phase and will be synchronized with the reference pulse signal $\bar{S}_{r1}$.

When the response control pulse signal $\bar{S}_{c1}$ swings from the logic "0" level to logic "1" level as at time $t_{10}$ as illustrated in FIG. 2, the pulse signal output from the delay-latch flip-flop circuit 28 similarly swings at the time $t_6$ when the pulse signal input to the control terminal C of the flip-flop circuit 28 rises after time $t_{10}$. As a consequence, the output pulse signal $S_4'$ from the NOR gate 36 swings from the logic "1" level to logic "0" level and causes the n-channel field-effect transistor 40 of the charge pump circuit 32 to turn off at time $t_6$. The p-channel field-effect transistor 38 of the charge pump circuit 32 having already been turned off, the second voltage signal $S_7$ at the output node 42 of the charge pump circuit 32 shifts back to the floating level upon lapse of the phase difference detect period $t_D$ at time $t_6$.

During the phase difference detect period $t_D$ intervening between the times $t_8$ and $t_9$, the pulse signal $S_3$ is of the logic "0" level and concurrently the pulse signal $S_4$ is of the logic "1" level. The n-channel field-effect transistor 20 of the first charge pump circuit 16 is thus turned off at time $t_8$ so that a high voltage approximating the positive supply voltage $V_{DD}$ appears as the first voltage signal $S_5$ of a high level at the output node 24 of the charge pump circuit 16. The output signal from the delay-latch flip-flop circuit 28 being maintained at the logic "1" level, the OR gate 34 of the logic circuit 30 is producing a logic "1" pulse signal $S_3'$ at its output terminal so that the p-channel field-effect transistor 38 of the second charge pump circuit 32 is turned off. In the presence of the logic "1" pulse signal at the output terminal Q of the flip-flop circuit 28, furthermore, the NOR gate 36 of the logic circuit 30 is producing a logic "0" pulse signal $S_4'$ so that the p-channel field-effect transistor 38 of the second charge pump circuit 32 is turned off. The second voltage signal $S_7$ at the output node 42 of the charge pump circuit 32 is thus maintained at a high-impedance state floating between the supply voltage $V_{DD}$ and ground potential $V_{SS}$ without rising at time $t_8$ (as indicated in phantom at X in FIG. 2). Under these conditions, only the first voltage signal $S_5$ at the output node 24 of the first charge pump circuit 16 is increased to the level approximating the supply voltage $V_{DD}$ so that the control voltage signal $S_8$ resulting from the voltage signals $S_5$ and $S_7$ increases at a reduced rate. Such a control voltage signal $S_8$ is supplied to the voltage controlled oscillator circuit 58 to increase the control voltage for the oscillator circuit 58 now at a reduced rate so that the oscillator circuit 58 is conditioned to generate pulses with a phase advanced at a limited rate. It will thus be understood that the response control signal $\bar{S}_{c1}$ used in the phase locked loop circuit embodying the present invention is effective to provide a shift between the rates at which the voltage controlled oscillator circuit 58 responds to the pulse signals $S_3$ and $S_4$ from the phase comparator 14 during a phase difference detect period $t_D$ or $t_A$.

As will have been understood from the foregoing description, the set-reset flip-flop circuit 10, monostable multivibrator 12, phase comparator circuit 14 and logic circuit 30 in the embodiment hereinbefore described with reference to FIG. 1 implement phase difference detecting means responsive to the reference signal $\bar{S}_{r1}$ and to the variable-phase signal $\bar{S}_{v1}$ for producing output signals ($S_3/S_4/S_3'/S_4'$) containing information indicative of a difference in phase, if any, between the reference signal $\bar{S}_{r1}$ and the variable-phase signal $\bar{S}_{v1}$. Furthermore, the first and second charge pump circuits 16 and 32 implement current supply means responsive to the output signals ($S_3/S_4/S_3'/S_4'$) from the phase difference detecting means (10/12/14/30/62) for producing a charge current or a discharge current depending upon the information represented by the output signals ($S_3/S_4/S_3'/S_4'$) from the phase difference detecting means (10/12/14/30/62). On the other hand, the low-pass filter circuit 48 in the embodiment of FIG. 1 implements frequency control means responsive to the charge current or the discharge current from the current supply means (16/32) for producing a frequency control signal ($S_8$) on the basis of which the frequency at which the voltage-controlled oscillator circuit 58 is to oscillate is controlled. In addition, the NOR gate 26 and the delay-latch flip-flop circuit 28 implement response control means responsive to the response control signal $\bar{S}_{c1}$ for prohibiting the current supply means (16/32) from producing the charge current or discharge current.

It has been assumed in the foregoing description that the response control signal $\bar{S}_{c1}$ per se rises at time $t_{10}$ which intervenes between the times $t_5$ and $t_6$ at which the phase difference detect period $t_4$ begins and terminates. It may be noted in this instance that, although the response control signal $\bar{S}_{c1}$ per se may thus change its logic state (viz., rise or fall) prior to the termination of the phase difference detect period $t_4$, it is just at the time of termination of the period $t_D$ when the pulse signal output from the delay-latch flip-flop circuit 28 changes its logic state as from the logic "0" level to logic "1" level at time $t_6$ in response to the rise of the pulse signal $S_6$ supplied to the control terminal C of the flip-flop circuit 28. This means that, if the response control signal $\bar{S}_{c1}$ happens to change its logic state during a phase difference detect period $t_4$ (or also $t_4$), the information provided by the pulse signals $S_3$ and $S_4$ regarding the phase difference of the pulse signal $\bar{S}_{v1}$ advanced or delayed with respect to the reference pulse signal $\bar{S}_{r1}$ during such a period of time could not be lost or vanish.

It has been assumed that the monostable multivibrator 12 is operative so that the output pulse signal $S_2$ produced in response to the input pulse signal $S_1$ has a pulsewidth T/2 equal to the period T of the reference pulse signal $\bar{S}_{r1}$ as shown in FIG. 2. This however is not critical, in the present invention and, thus, the pulsewidth of the output pulse signal $S_2$ to be produced by the monostable multivibrator 12 may be selected appropriately with respect to the period T of the reference pulse signal $\bar{S}_{r1}$.

Figure 3:
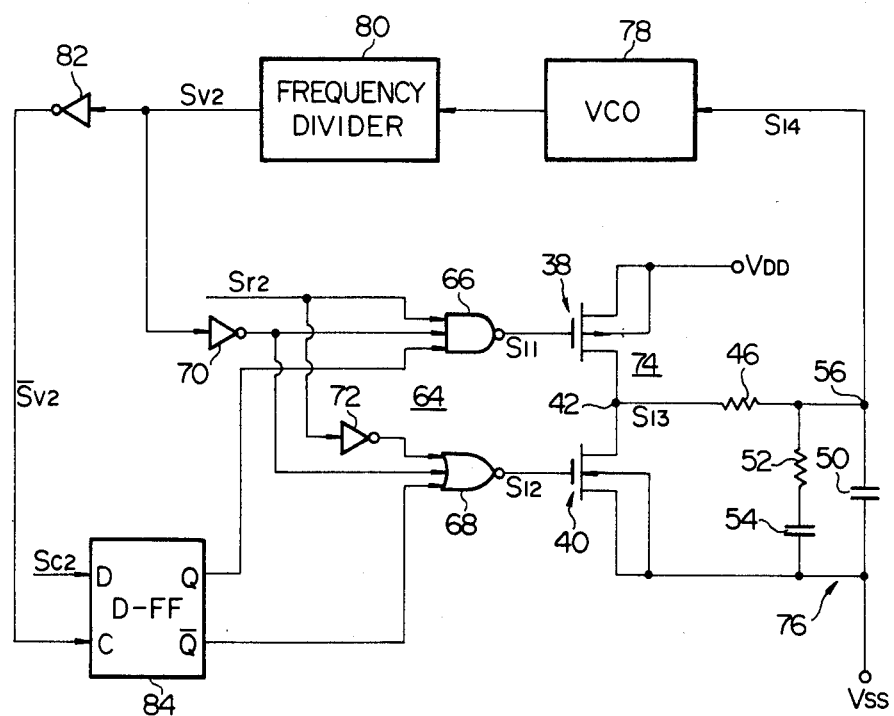
FIG. 3 is a block diagram showing another preferred embodiment of a phase locked loop circuit according to the present invention.

FIG. 3 of the drawings shows another preferred embodiment of a phase locked loop circuit according to the present invention. The phase locked loop circuit now comprises a logic circuit comprising a parallel combination of a three-input logic NAND gate 66 and a three-input logic NOR gate 68. The NAND gate 66 has a first input terminal responsive to a reference pulse signal $S_{r2}$, a second input terminal responsive to a varaible input pulse signal $S_{v2}$ through a first inverter 70, and a third input terminal to be described. The reference pulse signal $S_{r2}$ has a predetermined period T' as shown in the time chart of FIG. 4. The NAND gate 66 further has an output terminal to produce an output pulse signal $S_{11}$ of logic "0" or "1" depending upon the logic states of the signals to appear at the input terminals thereof.

The NOR gate 68 has a first input terminal responsive to the reference pulse signal $S_{r2}$ through a second inverter 72, a second input terminal responsive to the pulse signal $S_{v2}$ through the inverter 70, and a third input terminal to be described. The NOR gate 68 further has an output terminal to produce an output pulse signal $S_{12}$ of logic "0" or "1" depending upon the logic states of the signals to appear at the input terminals thereof. The pulse signals $S_{11}$ and $S_{12}$ respectively output from the NAND and NOR gates 66 and 68 thus arranged are supplied to a charge pump circuit 74.

The charge pump circuit 74 per se is constructed similarly to the second charge pump circuit 32 of the phase locked loop circuit described with reference to FIG. 1 and, thus, comprises a series combination of p-channel and n-channel field-effect transistors 38 and 40 connected between the sources of the positive supply voltage $V_{DD}$ and ground potential $V_{SS}$ as shown. The p-channel field-effect transistor 38 of the charge pump circuit 74 has its gate connected to the output terminal of the NAND gate 66 and its source terminal connected to the source of the positive supply voltage $V_{DD}$. The n-channel field-effect transistor 40 of the charge pump circuit 74 has its gate connected to the output terminal of the logic NOR gate 68 and its source terminal connected to the source of the ground potential $V_{SS}$. The respective drain terminals of the transistors 38 and 40 are connected together to provide an output node 42 at which is to be produced a voltage signal $S_{13}$ of either a high level or a low level or a high-impedance state floating between the high and low levels depending on the respective logic states of the pulse signals appearing at the output terminals of the NAND and NOR gates 66 and 68. In the presence of a pulse signal of a logic "0" level at each of the output terminals of the NAND and NOR gates 66 and 68, the p-channel field-effect transistor 38 is turned on with the n-channel field-effect transistor 40 turned off. The output node 42 of the charge pump circuit 74 is now connected to the source of the positive supply voltage $V_{DD}$ through the p-channel field-effect transistor 38 so that a high voltage approximately the supply voltage $V_{DD}$ appears as the voltage signal $S_{13}$ at the output node 42 of the charge pump circuit 74. When, on the other hand, a pulse signal of a logic "1" level is present at each of the output terminals of the NAND and NOR gates 66 and 68, the n-channel field-effect transistor 40 is turned on and the p-channel field-effect transistor 38 turned off. The output node 42 of the charge pump circuit 74 is now connected to the source of the ground potential $V_{SS}$ through the n-channel field-effect transistor 40 so that a low voltage approximating the ground potential $V_{SS}$ appears as the voltage signal $S_{13}$ at the output node 42 of the charge pump circuit 74. Thus, the voltage signal $S_{13}$ of a high level as appearing at the output node 42 of the charge pump circuit 74 indicates that all of the pulse signals input to the NAND gate 66 are of logic "1" levels and, in addition, at least one of the pulse signals input to the NOR gate 68 is of a logic "1" level. On the other hand, the voltage signal $S_{13}$ of a low level as appearing at the output node 42 of the charge pump circuit 74 indicates that at least one of the pulse signals input to the NAND gate 66 is of a logic "0" level and, in addition, all of the pulse signals input to the NOR gate 68 are of logic "0" levels. When at least one of the pulse signals input to the NAND gate 66 is of a logic "0" level and, concurrently, at least one of the pulse signals input to the NOR gate 68 is of a logic "1" level, both of the p-channel and n-channel field-effect transistors 38 and 40 are turned off in the presence of a signal of a logic "1" level at the output terminal of the NAND gate 66 and a signal of a logic "0" level at the output terminal of the NOR gate 68. The voltage signal $S_{13}$ at the output node 42 of the charge pump circuit 74 now assumes a high-impedance state floating between the supply voltage $V_{DD}$ and ground potential $V_{SS}$.

The voltage signal $S_{13}$ thus appearing at the output node 42 of the charge pump circuit 74 is supplied through a resistor 46 to a low-pass filter network 76. The low-pass filter network 76 is similar to its counterpart in the phase locked loop circuit described with reference to FIG. 1 and comprises a capacitor 50 connected in parallel with a series combination of a resistor 52 and a capacitor 54. The low-pass filter network 76 is operative to smooth out the input voltage signal $S_{13}$ and has an output node 56 at which is to appear a control voltage signal $S_{14}$ which thus results from the voltage signal $S_{13}$. The control voltage signal $S_{14}$ thus appearing at the output node 56 of the low-pass filter network 76 is supplied to a voltage controlled oscillator circuit 78 (VCO) which has an output terminal connected to a frequency divider 80. The voltage controlled oscillator circuit 78 is also similar to its counterpart in the phase locked loop circuit described with reference to FIG. 1 and is operative to produce a pulse signal with a phase advanced in response to an increase in the control voltage signal $S_{14}$ and retarded in response to a decrease in the voltage signal $S_{14}$. The frequency divider 80 in turn has an output terminal connected through the inverter 70 to the second input terminal of each of the NAND and NOR gates 66 and 68 and further through a third inverter 82 to the control terminal C of a delay-latch flip-flop circuit 84. From the frequency divider 80 to the second input terminal of each of the NAND and NOR gates 66 and 68 is thus supplied the inverted version, $\overline{S}_{v2}$, of the pulse signal $S_{v2}$ to be controlled by the loop circuit under consideration. The frequency divider 80 may be of any of the desired types and/or designs known in the art.

The delay-latch flip-flop circuit 84 has, in addition to the control terminal C, an input terminal D responsive to a response control pulse signal $S_{c2}$. The delay-latch flip-flop circuit 84 is thus responsive to the response control pulse signal $S_{c1}$ and the pulse signal $\overline{S}_{v2}$ from the inverter 82 to produce at its non-inverted output terminal Q a pulse signal of a state which the pulse signal $\overline{S}_{c2}$ has at an instant the pulse signal $\overline{S}_{v2}$ from the inverter 82 rises from a logic "0" level to a logic "1" level (or, if desired, falls from the logic "1" level to the logic "0" level). The pulse signal thus appearing at the non-inverted output terminal Q of the delay-latch flip-flop circuit 84 is supplied to the third input terminal of the NAND gate 66 of the logic circuit 64. The delay-latch flip-flop circuit 84 is further operative to produce the inverted version of such a pulse signal at its inverted output terminal $\overline{Q}$. The pulse signal which appears at the inverted output terminal $\overline{Q}$ of the flip-flop circuit 84 is supplied to the third input terminal of the NOR gate 68 of the logic circuit 64.

Description will now be made with reference to FIGS. 3 and 4 in regard to the operation of the phase locked loop circuit thus constructed and arranged.

Figure 4:
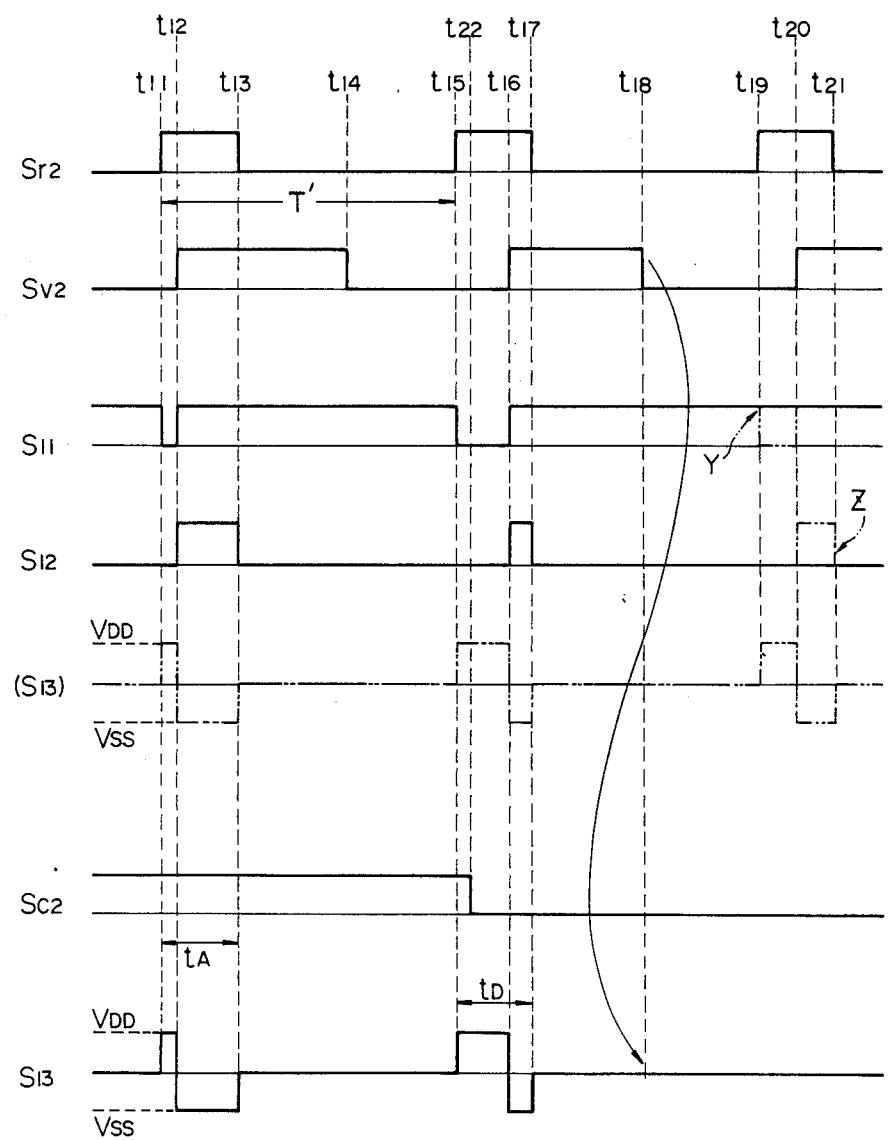
FIG. 4 is a time chart showing the waveforms of various pulse signals which may appear in the phase locked loop circuit which is shown in FIG. 3.

It is assumed by way of example that the reference pulse signal $S_{r2}$ herein used is to rise at times $t_{11}$, $t_{15}$, $t_{19}$, ... and to fall at times $t_{13}$, $t_{17}$, $t_{21}$, ... while the pulse signal $S_{v2}$ is to rise at times $t_{12}$, $t_{16}$, $t_{20}$, which are respectively subsequent to the times $t_{11}$, $t_{15}$, $t_{19}$, ... and to fall at times $t_{14}$, $t_{16}$, $t_{18}$, ... which are respectively subsequent to the times $t_{13}$, $t_{17}$, ... as shown in the time chart of FIG. 4. As noted previously, the reference pulse signal $S_{r2}$ has a predetermined period T so that the times $t_{11}$, $t_{15}$, $t_{19}$, ... are herein assumed to occur at intervals equal to the period of cycle T. From FIG. 4 it will be further seen that the pulse signal $S_{v2}$ to be controlled by the phase locked loop circuit shown has a leading edge either advanced or delayed with respect to the middle point of a period for which the reference pulse signal $s_{r2}$ remains at a logic "1" level. The pulse signal $S_{v2}$ has a leading edge advanced with respect to the middle point of the period intervening between the times $t_1$ and $t_4$ or between the time $t_7$ and the time (not shown) at which the pulse signal $\overline{S}_{v2}$ is to fall thereafter. The pulse signal $\overline{S}_{v1}$ further has a leading edge which is delayed with respect to the middle point $t_6$ of the period intervening between the times $t_4$ and $t_7$. It is further assumed that the reference control pulse signal $S_{c2}$ supplied to the input terminal D of the delay-latch flip-flop circuit 28 remains at a logic "1" level by time $t_{22}$ intervening between the times $t_{15}$ and $t_{16}$ and swings from the logic "1" level to a logic "0" level at such a time $t_{22}$ as also shown in the time chart of FIG. 4. As will be seen as the description proceeds, it is at time $t_{18}$ when there appear logic "0" and "1" pulse signals at the non-inverted and inverted output terminals Q and $\overline{Q}$, respectively, of the delay-latch flip-flop circuit 84 in response to the fall of the pulse signal $S_{v2}$ for the first time after the reference control pulse signal $S_{c2}$ has fallen from the logic "1" level to logic "0" level at time $t_{22}$.

As long as the logic "1" and "0" pulse signals are maintained at the non-inverted and inverted output terminals Q and $\overline{Q}$, respectively, of the delay-latch flip-flop circuit 84, the conditions of the NAND and NOR gates 66 and 68 of the logic circuit 64 depend on the logic states of the reference pulse signal $S_{r2}$ and the pulse signal $S_{v2}$ to be controlled. In the presence of reference pulse signal $S_{r2}$ of a logic "1" level and the pulse signal $S_{v2}$ of a logic "0" level, the pulse signals at all of the input terminals of the NAND 66 are maintained at the logic "1" levels so that there appears a logic "0" signal as the pulse signal $S_{11}$ at the output terminal of the NAND gate 66 as during the period intervening the times $t_{11}$ and $t_{12}$ or the period intervening the times $t_{15}$ and $t_{17}$ as shown in FIG. 4. Under these conditions, the pulse signal $S_{12}$ output from the NOR gate 68 remains at a logic "0" level in the presence of a logic "1" pulse signal appearing at the second input terminal of the NOR gate 68 in response to the pulse signal $S_{v2}$ of the logic "0" level which is inverted by the first inverter 70. Under other conditions, the pulse signal at least one of the input terminals of the NAND 66 is maintained at the logic "0" level so that there appears a logic "1" signal as the pulse signal $S_{11}$ at the output terminal of the NAND gate 66. If, in this instance, both of the pulse signals $S_{r2}$ and $S_{v2}$ are at the logic "1" levels, the pulse signals at all the input terminals of the NOR gate 68 are maintained at the logic "0" levels so that there appears a logic "1" signal as the pulse signal $S_{12}$ at the output terminal of the NOR gate 68 as during the period intervening the times $t_{12}$ and $t_{13}$ or the period intervening the times $t_{16}$ and $t_{17}$ as shown in FIG. 4. Under these conditions, the pulse signal $S_{11}$ output from the NAND gate 66 remains at the logic "1" level in the presence of the logic "0" pulse signal appearing at the second input terminal of the NAND gate 66 in response to the pulse signal $S_{v2}$ of the logic "1" level which is inverted by the inverter 70.

It will thus be seen that the pulse signal $S_{11}$ from the NAND gate 66 assumes the logic "0" level in the presence of the reference pulse signal $S_{r2}$ of the logic "1" level and the pulse signal $S_{v2}$ of the logic "0" level while the pulse signal $S_{12}$ from the NOR gate 68 assumes the logic "1" level in the presence of the reference pulse signal $S_{r2}$ and pulse signal $S_{v2}$ both of the logic "1" levels. In the presence of the pulse signals $S_{11}$ and $S_{12}$ of the logic "0" levels at the output terminals of the NAND and NOR gates 66 and 68, respectively, the p-channel field-effect transistor 38 of the charge pump circuit 74 is turned on as at time $t_{11}$ with the n-channel field-effect transistor 40 turned off. A high voltage approximating the positive supply voltage $V_{DD}$ thus appears as the voltage signal $S_{13}$ of a high level at the output node 42 of the charge pump circuit 74 as will be sen from the bottom section of FIG. 4. In the presence, on the other hand, of the pulse signals $S_{11}$ and $S_{12}$ of the logic "1" levels at the output terminals of the NAND and NOR gates 66 and 68, respectively, the n-channel field-effect transistor 40 of the charge pump circuit 74 is turned on as at time $t_{12}$ with the p-channel field-effect transistor 38 turned off. A low voltage approximating the ground potential $V_{SS}$ thus appears as the voltage signal $S_{13}$ of a low level at the output node 42 of the charge pump circuit 74 as will also be seen from FIG. 4. The high or low voltage signal $S_{13}$ thus produced at the output node 42 of the charge pump circuit 74 is fed to the low-pass filter network 76 which smoothes out the voltage signal $S_{13}$ and produces at its output node 56 the previously mentioned control voltage signal $S_{14}$ resulting from the voltage signal $S_{13}$.

The control voltage signal $S_{14}$ supplied from the low-pass filter network 76 generally represents the mean value of the high and low levels of the voltage signal $S_{13}$ produced at the node 42 of the charge pump circuit 74 as during the period intervening between the times $t_{11}$ and $t_{13}$ or the period intervening between the times $t_{15}$ and $t_{17}$. The difference between such a mean value of the voltage signal $S_{13}$ and the arithmetic means value $(V_{DD}+V_{SS})/2$ of the supply and ground voltages is proportional to the amount of phase difference between the leading edges of the pulse signals $S_{v2}$ and $S_{r2}$. This means that the difference between the mean value of the voltage signal $S_{13}$ and the arithmetic means value of the voltages $V_{DD}$ and $V_{SS}$ provides information regarding the phase difference of the pulse signal $S_{v2}$ advanced or delayed with respect to the pulse signal $S_{r2}$ during a period of time for which the voltage signal $S_{13}$ is first increased to the high level and thereafter reduced to the low level as during the period of time $t_{11}-t_{13}$ or $t_{15}-t_{17}$. In respect of the embodiment shown in FIG. 3, such a period of time will be herein referred to as phase difference detect period and is also denoted by $t_A$ for an advanced phase and by $t_D$ for a delayed phase in the time chart of FIG. 4.

The control voltage signal $S_{14}$ produced at the output node 56 of the low-pass filter network 76 as above described is supplied to the voltage controlled oscillator circuit 78 to increase or decrease the control voltage for the oscillator circuit 78. During the phase difference detect periods $t_A$ for which the pulse signal $S_{v2}$ to be controlled is forwardly out of phase with the reference pulse signal $S_{r2}$ as during the period $t_{11}-t_{13}$, the voltage controlled oscillator circuit 78 receives the control voltage signal $S_{14}$ which is decreased in response to the voltage signal $S_{13}$. In response to such a control voltage signal $S_{14}$, the voltage controlled oscillator circuit 78 is conditioned to generate pulses with a delayed phase so that the pulse signal $S_{v2}$ to be controlled synchronizes with the reference pulse signal $S_{r2}$. On the other hand, during the phase difference detect periods $t_D$ for which the pulse signal $S_{v2}$ to be controlled is backwardly out of phase with the reference pulse signal $S_{r2}$ as during the period $t_{15}-t_{17}$, the voltage controlled oscillator circuit 78 receives the control voltage signal $S_{14}$ increased in response to the voltage signal $S_{13}$. In response to such a control voltage signal $S_{14}$, the voltage controlled oscillator circuit 78 is conditioned to generate pulses with an advanced phase so that the pulse signal $S_{v2}$ synchronizes with the reference pulse signal $S_{r2}$. As the pulses generated by the voltage controlled oscillator circuit 78 are thus advanced or retarded in phase, the pulse signal output from the frequency divider 80 is also advanced or retarded in phase and will be synchronized with the reference pulse signal $S_{r2}$. The resultant pulse signal $S_{v2}$ is inverted by each of the inverters 70 and 82 and the inverted version $\bar{S}_{v2}$ of the pulse signal $S_{v2}$ is passed from the inverter 70 to the second input terminal of each of the NAND and NOR gates 66 and 68 and from the inverter 82 to the control termiinal C of the delay-latch flip-flop circuit 84.

When the pulse signal $S_{11}$ from the NAND gate 66 remains at the logic "1" level with both of the pulse signals $S_{v2}$ and $S_{r2}$ at the logic "0" or logic "1" levels, the pulse signal at one of the first and second input terminals of the NAND gate 66 is maintained at the logic "0" level so that the associated p-channel field-effect transistor 38 of the charge pump circuit 74 remains turned off. Under these conditions, the pulse signal at one of the first and second input terminals of the NOR gate 68 is maintained at the logic "1" level so that the associated n-channel field-effect transistor 40 of the charge pump circuit 74 also remains turned off. The voltage signal $S_{13}$ at the output node 42 of the charge pump circuit 74 therefore assumes a high-impedance state floating between the supply voltage $V_{DD}$ and ground potential $V_{SS}$ as will be also seen from FIG. 4.

The pulse signal $\bar{S}_{v2}$ produced from the inverter 70 is supplied to the control terminal C of the delay-latch flip-flop circuit 84 which is receiving the response control pulse signal $S_{c2}$ at its input terminal D. The pulse signal $\bar{S}_{v2}$ thus appearing at the control terminal C of the flip-flop circuit 84 falls at times $t_{12}$, $t_{16}$, $t_{20}$, . . . and rises at times $t_{14}$, $t_{18}$, . . . as will be seen from FIG. 4. On the other hand, the reference control pulse signal $S_{c2}$ appearing at the input terminal D of the flip-flop circuit 84 swings from the logic "1" level to the logic "0" level as at time $t_{22}$ intervening between the times $t_{15}$ and $t_{16}$. At this point of time $t_{22}$, however, the pulse signal $\bar{S}_{v2}$ at the control terminal C of the flip-flop circuit 84 remains at the logic "1" level so that the pulse signals at the non-inverted and inverted output terminals Q and $\bar{Q}$ of the delay-latch flip-flop circuit 28 still remain at the logic "1" and "0" levels, respectively.

At time $t_{18}$ subsequent to the phase difference detect period $t_D$ which has already terminated at time $t_{17}$, the pulse signal $\bar{S}_{v2}$ appearing at the control terminal C of the delay-latch flip-flop circuit 84 rises from the logic "0" level to logic "1" level. The pulse signal at the non-inverted output terminal Q of the flip-flop circuit 28 is now allowed to fall from the logic "1" level to logic "0" level and the pulse signal at the inverted output terminal $\bar{Q}$ of the flip-flop circuit 28 allowed to rise from the logic "0" level to logic "1" level. With the logic "0" pulse signal thus produced at its third input terminal, the NAND gate 66 of the logic circuit 64 now outputs a logic "1" pulse signal to maintain the associated p-channel field-effect transistor 38 of the charge pump circuit 32 turned off after time $t_{18}$ as will be seen from FIG. 4. Likewise, the NOR gate 68 of the logic circuit 64 receives the logic "1" pulse signal at its third input terminal and outputs a logic "0" pulse signal to maintain the associated n-channel field-effect transistor 40 of the charge pump circuit 32 also turned off after the time $t_{18}$.

During the period intervening between times $t_{19}$ and $t_{20}$, the NAND gate 66 receives logic "1" pulse signals at both of its first and second input terminals. If a logic "1" pulse signal were present also at its third input terminal, the NAND gate 66 would then produce a logic "0" signal as the pulse signal $S_{11}$ as indicated in phantom at Y in FIG. 4 if a logic "0" pulse signal were present at its third input terminal. Likewise, the NOR gate 68 would produce a logic "0" signal as the pulse signal $S_{12}$ as indicated in phantom at z in FIG. 4 during the period intervening between times $t_{20}$ and $t_{21}$. In the presence, actually, of a logic "0" pulse signal at the third input terminal of the NAND gate 66 and a logic "1" pulse signal at the third input terminal of the NOR gate 68, there could be no such pulses as indicated at Y and Z produced at the output terminals of the NAND and NOR gates 66 and 68, as will be seen from the bottom section of FIG. 4. After time $t_{18}$, the p-channel and n-channel field-effect transistors 38 and 40 of the charge pump circuit 74 thus remain in non-conduction states so that the output node 42 of the charge pump circuit 74 is maintained at a high-impedance state floating between the supply voltage $V_{DD}$ and ground potential $V_{SS}$.

As will have been understood from the foregoing description, the logic cirucit 64 and inverters 70 and 72 in the embodiment hereinbefore described with reference to FIG. 3 implement phase difference detecting means responsive to the reference signal $S_{r2}$ and to the variable-phase signal $S_{v2}$ for producing output signals ($S_{11}/S_{12}$) containing indicative of a difference in phase, if any, between the reference signal $S_{r2}$ and the variable-phase signal $S_{v2}$. Furthermore, the charge pump circuit 74 implements current supply means (74) responsive to the output signals ($S_{11}/S_{12}$) from the phase difference detecting means (64/70/72) for producing a charge current or a discharge current depending upon the information represented by the output signals ($S_{11}/S_{12}$) from the phase difference detecting means (64/70/72). On the other hand, the low-pass filter circuit 76 in the embodiment of FIG. 3 implements frequency control means responsive to the charge current or the discharge current from the current supply means (74) for producing a frequency control signal $S_{14}$ on the basis of which the frequency at which the voltage-controlled oscillator circuit 78 is to oscillate is controlled. In addition, the inverter 82 and the delay-latch flip-flop circuit 84 implement response control means responsive to the response control signal $S_{c2}$ for prohibiting the current supply means (74) from producing the charge current or discharge current.

What is claimed is:

1. A phase locked loop circuit responsive to a reference signal and a response control signal having a preset transition time from one logic state to another, comprising (a) frequency-controllable oscillator means to oscillate at a controllable frequency for producing a variable-phase signal variable in phase, (b) phase difference detecting means responsive to said reference signal and said variable-phase signal for producing output signals containing information indicative of a difference in phase, if any, between said reference signal and said variable-phase signal, (c) current supply means responsive to the output signals from said phase difference detecting means for producing a charge current or a discharge current depending upon the information represented by the output signals from said phase difference detecting means, (d) frequency control means responsive to the charge current or the discharge current from said current supply means for producing a frequency control signal on the basis of which the frequency at which said frequency-controllable oscillator means is to oscillate is controlled, and (e) response control means responsive to said response control signal for prohibiting said current supply means from producing said charge current or discharge current, in which said phase locked loop circuit further comprises delay means operative to maintain the response control means irresponsive to said reference control signal while the signals containing the information indicative of the difference in phase between said reference signal and said variable-phase signal are being output from said phase difference detecting means.

2. A phase locked loop circuit responsive to a reference signal and a response control signal having a preset transition time, comprising (a) signal generating means for producing a variable-phase signal variable in phase, (b) phase difference detecting means responsive to said reference signal and said variable-phase signal for producing an output signal indicative of a delay or advance in phase of said variable-phase signal with respect to said reference signal during a phase difference detect period for which a difference in phase, if any, between said reference signal and said variable-phase signal is to be detected for each period of cycle of the variable-phase signal, (c) voltage signal generating means responsive to the output signal from said phase difference detecting means for producing a voltage signal having three different states consisting of a first state producing a voltage level effective to advance the phase of said variable-phase signal, a second voltage level effective to retard the phase of said variable-phase signal, and a third state floating between the first and second voltage levels and effective to maintain the phase of the variable-phase signal, (d) said signal generating means being responsive to said voltage signal for producing said variable-phase signal with an advanced phase in response to the first state of the voltage signal, with a retarded phase in response to the second state of the voltage signal, and a phase maintained in response to the third state of the voltage signal, and (e) response control means responsive to said response control signal for forcibly conditioning said voltage signal generating means to produce the voltage signal with said third state at a time later than said preset transition time of said response control signal and subsequent to said phase difference detect period.

3. A phase locked loop circuit responsive to a reference pulse signal and a response control pulse signal having a preset transition time, comprising
  (a) voltage-responsive pulse signal generating means for producing a variable-phase pulse signal which is variable in phase,
  (b) phase difference detecting means responsive to said reference pulse signal and said variable-phase pulse signal for producing a first output signal indicative of a delay in phase of said variable-phase pulse signal with respect to said reference pulse signal and a second output signal indicative of an advance in phase of said variable-phase pulse signal with respect to said reference pulse signal, during a phase difference detect period for which a difference in phase, if any, between said reference pulse signal and said variablephase pulse signal is to be detected for each period of cycle of the variable-phase pulse signal,
  (c) voltage signal generating means responsive to said first and second output signals for producing first and second voltage signals each having three different states consisting of a first state producing a first voltage level effective to advance the phase of said variable-phase pulse signal, a second voltage level effective to retard the phase of said variable-phase pulse signal and a third state floating between the first and second voltage levels and effective to maintain the phase of the variable-phase pulse signal,
  (d) voltage smoothing means for smoothing out said first and second voltage signals and thereby producing a control signal also having said three states,
  (e) said pulse signal generating means being responsive to said control voltage signal for producing said variable-phase pulse signal with an advanced phase in response to the first state of the voltage signal, with a retarded phase in response to the second state of the voltage signal, and a phase maintained substantially unchanged in response to the third state of the voltage signal, and
  (f) response control means responsive to said response control pulse signal for forcibly conditioning said voltage signal generating means to produce the first and second voltage signals with said third state at a time later than said preset transition time of said response control pulse signal and subsequent to said phase difference detect period.

4. A phase locked loop circuit responsive to a reference pulse signal and a response control pulse signal having a preset transition time, comprising
  (a) voltage-responsive pulse signal generating means for producing a variable-phase pulse signal which has two logic states and which is variable in phase,
  (b) phase difference detecting means responsive to said reference pulse signal and said variable-phase pulse signal for producing, during a phase difference detect period for which a difference in phase, if any, between said reference pulse signal and said variable-phase pulse signal is to be detected for each period of cycle of the variable-phase pulse signal, a first output signal having one logic state and lasting from the beginning of said phase difference detect period to an intermediate time at which said variable-phase pulse signal swings from one logic state to another and a second output signal having another logic state and lasting from said intermediate time to the end of said phase difference detect period,
  (c) voltage signal generating means responsive to said first and second output signals for producing a voltage signal having three different states consisting of a first state producing a first voltage level effective to advance the phase of said variable-phase pulse signal in response to said first output signal, a second voltage level effective to retard the phase of said variable-phase pulse signal in response to said second output signal, and a third state floating between the first and second voltage levels and effective to maintain the phase of the variable-phase pulse signal, the voltage signals with said third state being produced prior and posterior to said phase difference detect period during each period of cycle of the variable-phase pulse signal,
  (d) said pulse signal generating means being responsive to said voltage signal for producing said variable-phase pulse signal with an advanced phase in response to the first state of the voltage signal, with a retarded phase in response to the second state of the voltage signal, and a phase maintained substantially unchanged in response to the third state of the voltage signal, and
  (e) response control means responsive to said response control pulse signal for forcibly conditioning said voltage signal generating means to produce the voltage signal with said third state at a time later than said preset transition time of said response control pulse signal and subsequent to said phase difference detect period.

5. A phase locked loop circuit responsive to a reference pulse signal consisting of a series of pulses with equal durations and a response control pulse signal having a preset transition time from one logic state to another, comprising
  (a) voltage-responsive pulse signal generating means for producing a variable-phase pulse signal which is variable in phase and which has transition times from a first logic state to a second logic state which occur at variable intervals and transition times from the second logic state to the first logic state which occur at variable intervals alternately to the transition times from the first logic state to the second logic state thereof,
  (b) first memory means responsive to said reference pulse signal and said variable-phase pulse signal for producing an output pulse signal having transition times from a first logic state to a second logic state in one predetermined relationship to said reference pulse signal and transition times from the second logic state to the first logic state in another predetermined relationship to said reference pulse signal,
  (c) second memory means responsive to the output pulse signal of said first memory means for producing an output pulse signal synchronized in phase with said reference pulse signal and consisting of a series of pulses each with a duration which is a predetermined fraction of each of the durations of the pulses forming the output pulse signal from said first memory means,
  (d) phase detecting means responsive to the output pulse signal from said first memory means and the output pulse signal from said second memory means for producing a first output pulse signal indicative of a delay in phase of said variable-phase pulse signal with respect to said reference pulse signal and a second output pulse signal indicative of an advance in phase of said variable-phase pulse signal with respect to said reference pulse signal, during a phase difference detect period for which either said first output pulse signal or said second output pulse signal is indicative of a difference in phase, if any, between said reference pulse signal and said variable-phase pulse signal for each period of cycle of the variable-phase pulse signal, (e) first voltage signal generating means responsive to the first output pulse signal from said phase detecting means for producing a first voltage signal having three different states consisting of a first state producing a voltage effective to advance the phase of said variable-phase pulse signal in response to said first output pulse signal, a second state producing a voltage effective to retard the phase of said variable-phase pulse signal in response to said second output pulse signal and a third state floating between the first and second states and effective to maintain the phase of the variable-phase pulse signal in response to said first and second output pulse signals, (f) logic circuit means having a first operative state to produce a pulse signal identical in logic state with the first output pulse signal from said phase detecting means and a pulse signal opposite in logic state to the second output pulse signal from said phase detecting means and a second operative state to produce a pulse signal with a predetermined logic state without respect to the first output pulse signal from said phase detecting means and a pulse signal with a predetermined logic state without respect to the second output pulse signal from said phase detecting means, (g) second voltage signal generating means responsive to the pulse signals from said logic circuit means for producing a second voltage signal having three different states consisting of a first state producing a voltage effective to advance the phase of said variable-phase pulse signal depending on the logic states of the signals from the logic circuit means of said first operative state, a second state producing a voltage effective to retard the phase of said variable-phase pulse signal depending on the logic states of the signals from the logic circuit means of said first operative state, and a third state floating between the first and second states and effective to maintain the phase of the variable-phase pulse signal in response to he signals with said predetermined logic states from the logic circuit means of said second operative state, (h) voltage smoothing means for smoothing out said first and second voltage signals and thereby producing a control voltage signal also having said three states, (i) said pulse signal generating means being responsive to said control voltage signal for producing said variable-phase pulse signal with its phase advanced in response to the first state of the voltage signal, retarded in response to the second state of the voltage signal, or maintained substantially unchanged in response to the third state of the voltage signal, and (j) response control means responsive to said response control pulse signal for forcibly conditioning said logic circuit means to produce the signals with said predetermined logic states at a time later than said preset transition time of said response control pulse signal and subsequent to said phase difference detect period.

6. A phase locked loop circuit as set forth in claim 5, in which said first output pulse signal from said phase detecting means has a logic "0" level when indicative of a delay in phase of said variable-phase pulse signal with respect to said reference pulse signal and said second output pulse signal from said phase detecting means has a logic "0" level when indicative of an advance in phase of said variable-phase pulse signal with respect to said reference pulse signal, wherein said response control means comprises a first logic gate responsive to the output pulse signal from said first memory means and the output pulse signal from said second memory means, and a delay-latch flip-flop circuit having an input terminal responsive to said response control pulse signal, a control terminal connected to the output terminal of said logic gate, and an output terminal connected to said logic circuit means, said first voltage signal generating means comprises a charge pump circuit responsive to the first and second output pulse signals from said phase detecting means for producing said first voltage signal with said first state in response to said first and second output pulse signals each of a first logic state, with said second state in response to said first and second output pulse signals each of a second logic state, and with said third state in response to said first and second output pulse signals respectively of the second and first logic states thereof, said logic circuit means comprises a second logic gate having one input terminal responsive to the first output pulse signal from said phase detecting means and another input terminal connected to the output terminal of said delay-latch flip-flip circuit, and a third logic gate having one input terminal responsive to the second output pulse signal from said phase detecting means and another input terminal connected to the output terminal of said delay-latch flip-flop circuit, the logic circuit means providing said first operative state in response to one logic state of the signal output from said delay-latch flip-flop circuit and said second operative state in response to another logic state of the signal output from said delay-latch flip-flop circuit, said second voltage signal generating means comprises a charge pump circuit responsive to the output pulse signal from said second logic gate and the output pulse signal from said third logic gate for producing said first voltage signal with said first state in response to the output pulse signals each of a first logic state from said second logic gate and said third logic gate, with said second state in response to the output pulse signals each of a second logic state from said second logic gate and said third logic gate, and with said third state in response to the output pulse signals respectively of the second and first logic states from said second and third logic gates.

7. A phase locked loop circuit responsive to a reference pulse signal consisting of a series of pulses with equal durations and a response control pulse signal having a preset transition time from one logic state to another, comprising (a) voltage-responsive pulse signal generating means for producing a variable-phase pulse signal which is variable in phase and which has transition times from a first logic state to a second logic state which occur at variable intervals and transition times from the second logic state to the first logic state which occur at variable intervals alternately to the transition times from the first logic state to the second logic state thereof, (b) logic circuit means comprising a first logic gate operative to produce a first output signal in response to said reference pulse signal and through inverter means to said variable-phase pulse signal and a second logic gate operative to produce a second output signal in response to said variable-phase pulse signal and through inverter means to said reference pulse signal, said logic circuit means having a first operative state in which the first and second logic gates thereof act respectively as logic NAND and NOR gates and a second operative state in which the first logic gate produces an output signal with a first logic state without respect to the logic states of said reference pulse signal and said variable-phase pulse signal and the second logic gate produces an output signal with a second logic state opposite to said first logic state without respect to the logic states of said reference pulse signal and said variable-phase pulse signal, (c) voltage signal generating means responsive to said first and second output signals from said first and second logic gates, respectively, for producing a voltage signal having three different states consisting of a first state producing a voltage effective to advance the phase of said variable-phase pulse signal in response to said first output signal, a second state producing a voltage effective to retard the phase of said variable-phase pulse signal in response to said second output signal, and a third state floating between the first and second states and effective to maintain the phase of the variable-phase pulse signal, (d) voltage smoothing means for smoothing out said voltage signal from said voltage signal generating means and thereby producing a control voltage signal variable with the voltage signal of each of said first and secod states from the voltage signal generating means, (e) said pulse signal generating means being responsive to said control voltage signal for producing said variable-phase pulse signal with its phase advanced, retarded or maintained substantially unchanged in response to the control voltage signal, and (f) response control means responsive to said response control pulse signal for forcibly conditioning said first and second logic gates to have said second operative state at a time later than said preset transition time of said response control pulse signal and subsequent to said phase difference detect period.

8. A phase locked loop circuit as set forth in claim 7, in which said response control means comprises a delay-latch flip-flop circuit having an input terminal responsive to said response control pulse signal, a control terminal responsive to said variable-phase pulse signal through inverter means, and complementary output terminals respectively connected to said first and second logic gates.

9. A phase locked loop circuit responsive to a reference signal and a response control signal having a preset transition time from one logic state to another, comprising (a) frequency-controllable oscillator means to oscillate at a controllable frequency for producing a variable-phase signal variable in phase, (b) phase diffeence detecting means responsive to said reference signal and said variable-phase signal for producing output signals containing information indicative of a difference in phase, if any, between said reference signal and said variable-phase signal, (c) current supply means responsive to the output signals from said phase difference detecting means and having first and second current supply circuits capable of producing first and second currents, respectively, and a current summing circuit operative to sum the first and second current for producing a charge current or a discharge current depending upon the information represented by the output signals from said phase difference detecting means, (d) frequency control means responsive to the charge current or the discharge current from said current supply means for producing a frequency control signal on the basis of which the frequency at which said frequency-controllable oscillator means is to oscillate is controlled, and (e) response control means responsive to said response control signal for prohibiting one of said first and second current supply circuits of said current supply means from producing said charge current or discharge current.

* * * * *

UNITED STATES PATENT AND TRADEMARK OFFICE
CERTIFICATE OF CORRECTION

PATENT NO. : 4,774,479
DATED : September 27, 1988
INVENTOR(S) : HISAO TATEISHI

It is certified that error appears in the above-identified patent and that said Letters Patent is hereby corrected as shown below:

COLUMN 4, LINE 23,      Delete "$\bar{S}$" and insert --$\bar{R}$--,

COLUMN 4, LINE 36      Delete "predermined" and insert --predetermined--

COLUMN 5, LINE 17      Delete "$\bar{S}_4$" and insert --$S_4$--

COLUMN 9, LINE 25      after first occurrence of "the" and insert --pulse signals $\bar{S}_{v1}$ and $\bar{S}_{r1}$ in phase with each other, both of--

COLUMN 9, LINE 44      After " "0" " insert --level with the pulse signals $S_1$ and $S_2$ swung to the logic "1"--

UNITED STATES PATENT AND TRADEMARK OFFICE
CERTIFICATE OF CORRECTION

PATENT NO. : 4,774,479
DATED : September 27, 1988
INVENTOR(S) : HISAO TATEISHI

It is certified that error appears in the above-identified patent and that said Letters Patent is hereby corrected as shown below:

COLUMN 10, LINE 40      Delete "$S_{c1}$" insert --$\bar{S}_{c1}$--

COLUMN 17, LINE 19      Delete "sen" insert --seen--

COLUMN 18, LINE 25      Delete "termiinal" and insert --terminal--

COLUMN 26, LINE 25      Delete "diffeence" and insert --difference--

Signed and Sealed this

Fifteenth Day of August, 1989

*Attest:*

DONALD J. QUIGG

*Attesting Officer*      *Commissioner of Patents and Trademarks*